(12) United States Patent
Ushijima et al.

(10) Patent No.: US 6,909,184 B2
(45) Date of Patent: Jun. 21, 2005

(54) TAB TYPE SEMICONDUCTOR DEVICE

(75) Inventors: Toshihiro Ushijima, Yokohama (JP); Isao Baba, Chigasaki (JP); Takamitsu Sumiyoshi, Oita (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/278,272

(22) Filed: Oct. 22, 2002

(65) Prior Publication Data

US 2003/0042588 A1 Mar. 6, 2003

Related U.S. Application Data

(63) Continuation of application No. 09/733,623, filed on Dec. 7, 2000, now abandoned.

(30) Foreign Application Priority Data

Dec. 10, 1999 (JP) .......................................... 11-351902

(51) Int. Cl.⁷ ......................... H01L 23/48; H01L 23/52; H01L 29/40
(52) U.S. Cl. ...................... 257/739; 257/668; 257/669; 257/674; 257/692; 257/700
(58) Field of Search ............................... 257/668, 669, 257/674, 692, 700, 739, 734, 737, 738, 693, 676, 787, 792, 691, 778, 687

(56) References Cited

U.S. PATENT DOCUMENTS

| | | | |
|---|---|---|---|
| 5,278,105 A | 1/1994 | Eden et al. .................. 438/129 |
| 5,293,068 A | 3/1994 | Kohno et al. ................ 257/676 |
| 5,574,415 A | 11/1996 | Peterson ...................... 333/238 |
| 5,786,239 A | * 7/1998 | Ohsawa et al. .............. 438/123 |
| 5,892,277 A | * 4/1999 | Ikemizu et al. .............. 257/700 |
| 5,965,940 A | 10/1999 | Juenglin ...................... 257/752 |
| 6,198,165 B1 | 3/2001 | Yamaji et al. ............... 257/734 |
| 6,204,559 B1 | 3/2001 | Lin et al. ..................... 257/738 |
| 6,211,576 B1 | * 4/2001 | Shimizu et al. ............. 257/786 |
| 6,242,815 B1 | 6/2001 | Hsu et al. .................... 257/786 |
| 6,261,883 B1 | 7/2001 | Koubuchi et al. ........... 438/197 |
| 6,351,011 B1 | * 2/2002 | Whitney et al. ............. 257/355 |
| 6,428,641 B1 | * 8/2002 | Yoon et al. .................... 156/64 |

FOREIGN PATENT DOCUMENTS

| | | |
|---|---|---|
| JP | 03-105937 | 5/1991 |
| JP | 09-213832 | 8/1997 |
| JP | 2843315 | 10/1998 |
| JP | 11-40698 | 2/1999 |

* cited by examiner

*Primary Examiner*—George Eckert
*Assistant Examiner*—Chris C. Chu
(74) *Attorney, Agent, or Firm*—Hogan & Hartson, LLP

(57) ABSTRACT

There is disclosed a TAB style BGA type semiconductor device. This semiconductor device comprises a semiconductor chip on which an integrated circuit is formed, and a polyimide tape which has a conductive pattern and which is allowed to adhere to the semiconductor chip. The conductive pattern includes a bonding portion connected to the pad of the semiconductor chip, a pad portion connected to the outside electrode, and an electrically floating island-like portion in addition to a wiring portion for connecting the bonding portion and the pad portion.

19 Claims, 18 Drawing Sheets

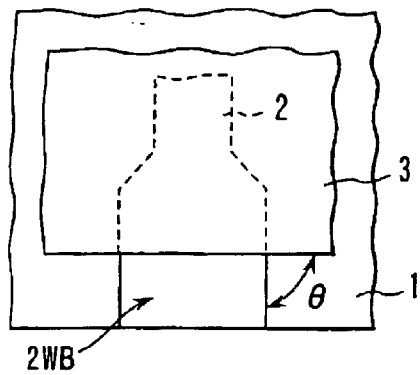 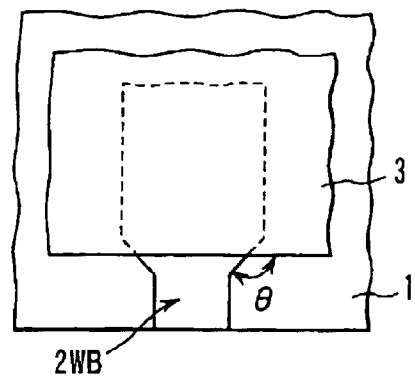
FIG. 14A    FIG. 14B
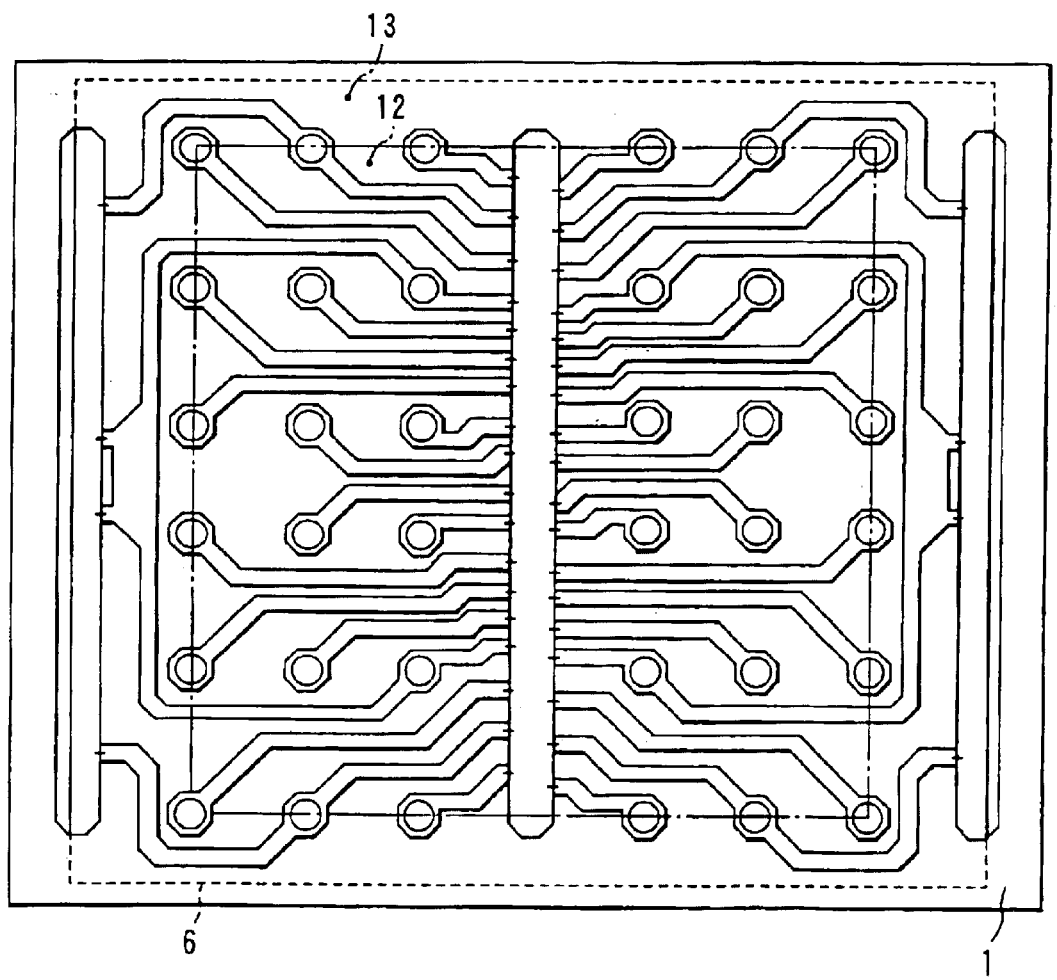
FIG. 15

TAB TYPE SEMICONDUCTOR DEVICE

This is a continuation of application Ser. No. 09/733,629 filed Dec. 7, 2000, abandoned which application is hereby incorporated by reference in its entirety.

CROSS-REFERENCE TO RELATED APPLICATIONS

This application is based upon and claims the benefit of priority from the prior Japanese Patent Application No. 11-351902, filed Dec. 10, 1999, the entire contents of which are incorporated herein by reference.

BACKGROUND OF THE INVENTION

The present invention relates to semiconductor devices, and more particularly to a TAB type ball grid array semiconductor device.

FIG. 1A is a plan view showing a conventional TAB type, FIG. 1B is a sectional view taken along the line 1B—1B of FIG. 1A. FIG. 1C is a sectional view taken along the line 1C—1C of FIG. 1A.

As shown in FIG. 1A through 1C, a Cu pattern 2 comprising copper (Cu) is formed on the surface of a polyimide tape (an insulating base) 1. The Cu pattern 2 is formed by allowing, for example, a copper foil to adhere to the polyimide tape 1, for example, with an adhesive agent and etching the Cu foil by using as a mask a resist layer having a pattern corresponding to, for example, the Cu pattern 2. On the surface of the polyimide tape 1, a solder resist layer 3 is formed, and this solder resist layer 3 is covered at least except for a wire bonding portion 2WB, and a ball pad portion 2BP.

On the rear surface of the polyimide tape 1, an adhesive agent layer 4 is formed. A protection tape 5 is allowed to adhere to the adhesive agent layer 4.

A semiconductor chip 6 is mounted on the TAB tape and is allowed to adhere to the TAB tape via the adhesive agent layer 4.

In allowing the semiconductor chip 6 to adhere to the TAB tape, as shown in FIG. 2A, the semiconductor chip 6 is picked up from the wafer-chip tray of the mounting device, and the semiconductor chip 6 is placed on a lower mold 22 of a pressurizing device.

Next, as shown in FIG. 2B, after the position of the TAB tape having the protection tape 5 peeled off and the position the semiconductor chip 6 is corrected, an upper mold 23 is allowed to come down so that the chip 6 is bonded onto the TAB tape.

However, with the conventional TAB tape, as shown in FIG. 1B, 1C or FIG. 2B, an uneven configuration is generated on the surface where the Cu pattern 2 is formed with the presence and absence of the Cu pattern 2. A concave portion 20 is a portion where no Cu pattern 2 is formed. A convex portion 21 is a portion where the Cu pattern 2 is formed.

Therefore, when the chip 6 is heat pressurized to the TAB tape, the pressure is concentrated on the convex portion 21 as shown in FIG. 2C with the result that the pressure is applied to the concave portion 22 with greater difficulty. A difference in this pressure distribution generates a difference in the adherence force between the TAB tape and the chip 6 which will lead to the peeling off of the TAB tape from the chip 6 later.

Furthermore, with the conventional TAB tape, as shown in FIG. 3A and FIG. 3B, there arises an intersection angle θ between the solder resist layer 3 and the wire bonding portion 2WB is less than 90 degrees.

Consequently, when the solder resist is printed on the TAB tape, a disuniformity is generated in the flow of the paste-like solder resist in the Cu pattern 2 particularly in the vicinity of the wire bonding portion 2WB, so that bubbles 24 are easily involved in the solder resist layer 3.

When bubbles are generated in the solder resist layer 3, and between the solder resist layer 3 and the polyimide tape 1. Water infiltrates into the bubbles from the outside so that the Cu pattern 2 is eroded with the lapse of time.

BRIEF SUMMARY OF THE INVENTION

The present invention has been made in view of the above circumstances. A first object of the invention is to provide a semiconductor device having a reduced difference in adherence force between an insulating base and a chip, and a stable adherence.

Furthermore, a second object of the invention is to provide a semiconductor device which suppresses the generation of bubbles and which has a high reliability against the erosion of a conductive pattern.

In order to attain the first object of the invention, according to a first aspect of the present invention, there is provided a semiconductor device comprising: a semiconductor chip having a pad; an insulating base which adheres to the semiconductor chip; a conductive pattern formed on the insulating base, the conductive pattern including a bonding portion connected to the pad of the semiconductor chip, a pad portion connected to an outside electrode, and a wiring portion connecting the bonding portion and the pad portion; and an electrically floating island-like portion formed on the insulating base.

According to the semiconductor device having the above structure, the uneven configuration can be alleviated which results from the presence and absence of the conductive layer by providing the electrically floating island-like portion on the insulating base. Consequently, the difference in the pressure distribution can be alleviated as compared with the conventional example, so that a difference in the adherence force between the insulating base and the chip can be reduced. Consequently, a semiconductor device having a stable adherence force can be obtained.

In order to attain a first object of the invention, according to a second aspect of the invention, there is provided a semiconductor device comprising: a semiconductor chip having a pad; an insulating base which adheres to the semiconductor chip; and a conductive pattern formed on the insulating base, the conductive pattern including a bonding portion connected to the pad of the semiconductor chip, a pad portion connected to an outside electrode, and a wiring portion connecting the bonding portion and the pad portion and having a tend portion with a different width.

According to the semiconductor device having the above structure, the uneven configuration resulting from the presence and absence of the conductive pattern can be alleviated by providing the extended portion mutually different width on the wiring portion of the conductive pattern. Consequently, in the same manner as the first aspect of the invention, the difference in the pressure distribution can be alleviated as compared with the conventional example with the result that the adherence force between the tape and the chip can be reduced. Thus, the semiconductor device having a stable adherence can be obtained.

In order to attain the second object, according to a third aspect of the present invention, there is provided a semiconductor device comprising: a semiconductor chip; an insulating base which adheres onto the semiconductor chip;

a conductive pattern formed on the insulating base, the conductive pattern including a bonding portion connected to the pad of the semiconductor chip, a pad portion connected to an outside electrode, and a wiring portion connecting the bonding portion and the pad portion; and a covering layer which covers the conductive pattern formed on the insulating base at least except for the bonding portion and the pad portion; wherein an intersection angle between the edge of the covering layer and the bonding portion is 90 degrees or more.

According to the semiconductor device having the above structure, the covering layer less involves bubbles on the conductive pattern particularly in the vicinity of the bonding portion at the time of forming the covering layer by setting an intersection angle between the covering layer and the terminal portion to 90 degrees or more. Consequently, a semiconductor device which suppresses the generation of bubbles and which has a high reliability against the corrosion of the conductive pattern can be obtained.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 14A and 14b are plan views showing basic patterns of a bonding portion respectively.

FIG. 15 is a plan view showing a semiconductor device according to a reference example of the present invention.

DETAILED DESCRIPTION OF THE INVENTION

Figure 1A:
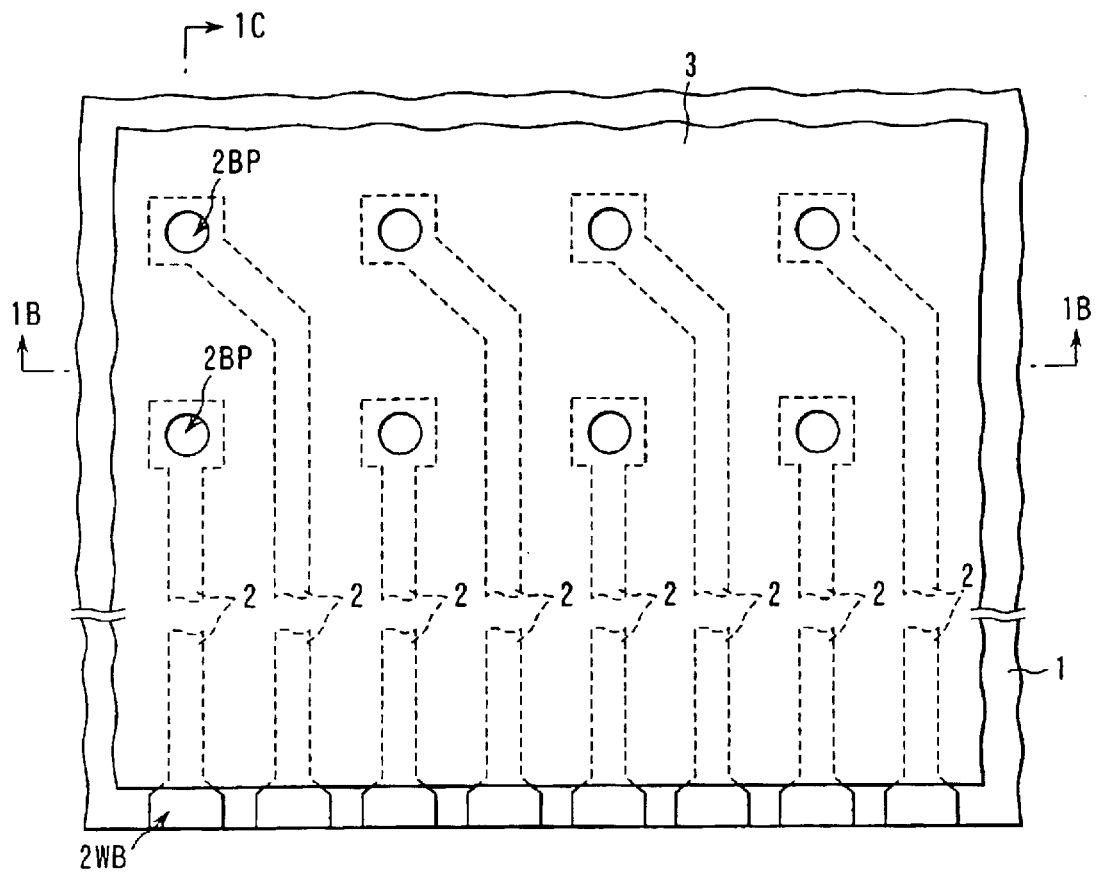
FIG. 1A is a plan view showing a conventional TAB tape.
Figure 1B:
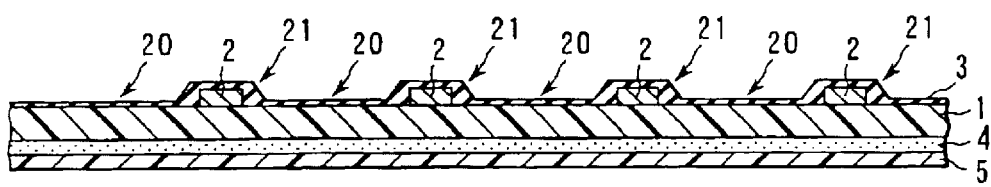
FIG. 1B is a sectional view taken along the line 1B—1B of FIG. 1A.
Figure 1C:
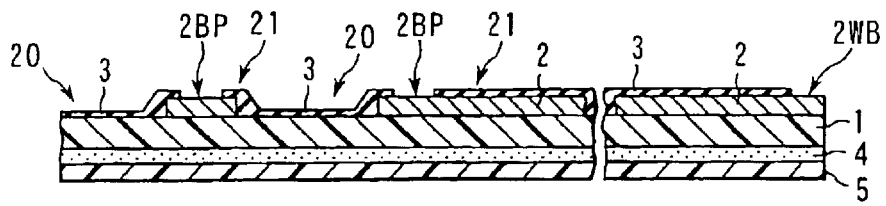
FIG. 1C is a sectional view taken along the line 1C—1C of FIG. 1A.

Hereinafter, embodiments of the present invention will be explained by referring to the drawings. In the explanation, common portions are denoted by common reference numerals over all the drawings.

(First Embodiment)

Figure 4A:
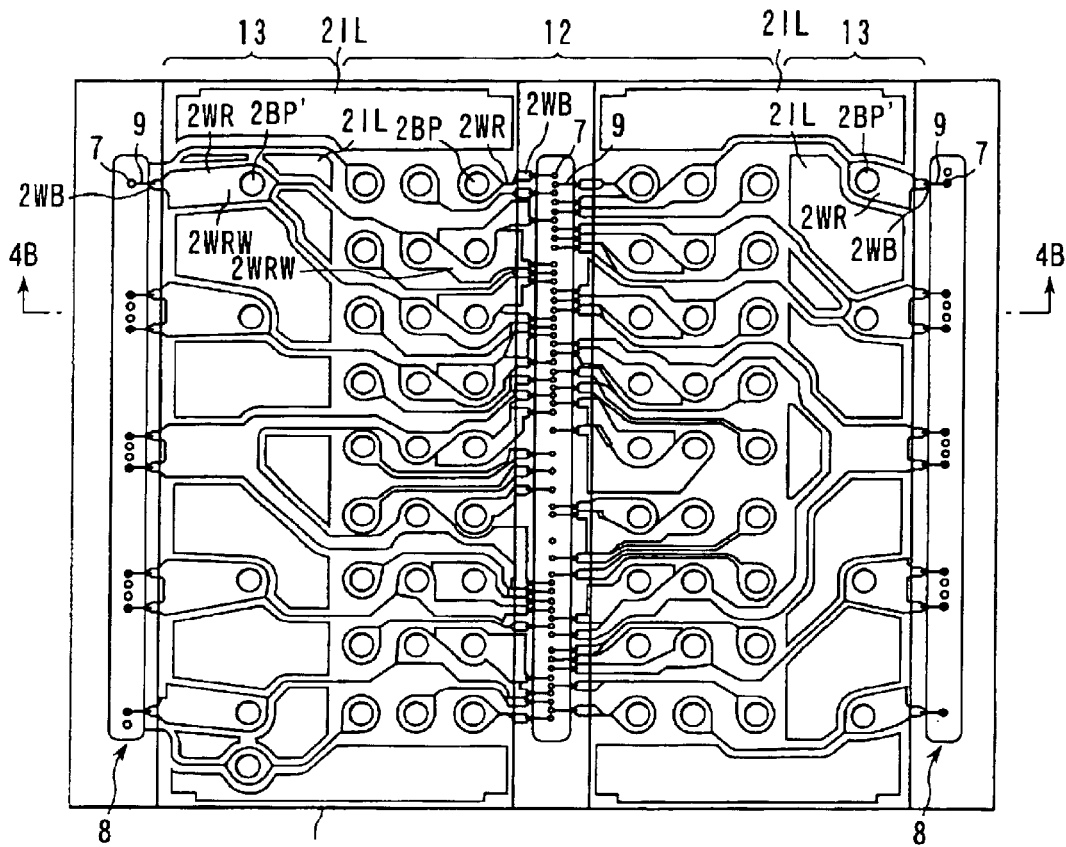
FIG. 4A is a plan view showing a semiconductor device according to a first embodiment of the present invention.
Figure 4B:
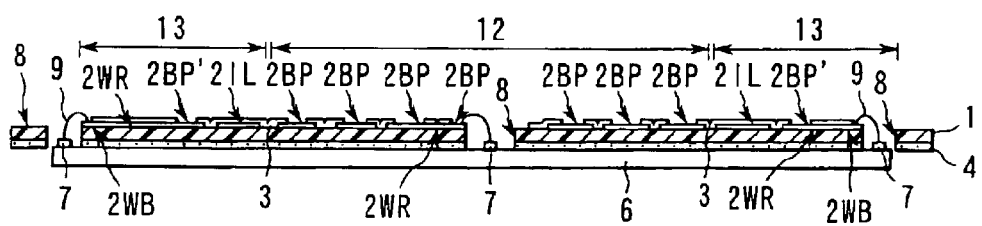
FIG. 4B is a sectional view taken along the line 4B–4b of FIG. 4A.

FIG. 4A is a plan view showing a semiconductor device according to a first embodiment of the present invention. FIG. 4B is a sectional view taken along the line 4B—4B of FIG. 4A.

As shown in FIGS. 4A and 4B, a Cu pattern (a conductive pattern) 2 comprising copper (Cu) is formed on the surface of a polyimide (an insulating base) 1. The Cu pattern 2 includes a wire bonding portion 2WB, a ball pad portion 2BP, and a wiring portion 2WR. The ball pad portion 2BP is arranged in a matrix-like configuration on a pad area 12 set approximately in the center of the polyimide tape 1. The wiring portion 2WR connects the wire bonding portion 2WB and the ball pad portion 2BP.

On the main surface of the polyimide tape 1, a solder resist layer (covering layer) 3 is formed. The solder resist layer 3 covers the Cu pattern 2 at least except for the wire bonding portion 2WB, and the ball pad portion 2BP. The polyimide tape 1 has an open hole 8 to which a pad 7 of a semiconductor chip 6 is exposed. The wire bonding portion 2WB is connected to the pad 7 which is exposed to the hole 8 via a bonding wire 9 comprising, for example, gold (Au).

On the rear surface of the polyimide tape 1, an adhesive layer 4 is formed, and the polyimide tape 1 is connected to the semiconductor chip 6 via the adhesive layer 4. An example of the adhesive agent of the layer 4 is an acryl-epoxy resin adhesive. In addition, a silicone resin adhesive or the like can be used.

Figure 4C:
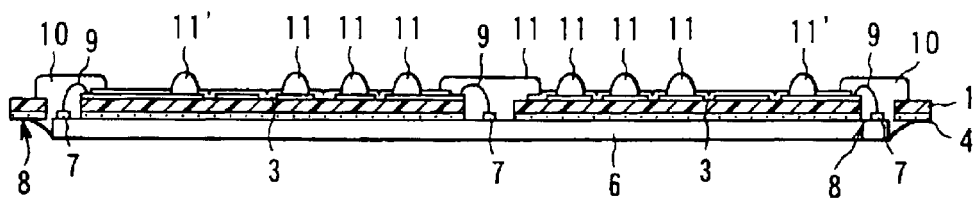
FIG. 4C is a sectional view showing the state after the completion of the device.

FIG. 4C is a sectional view showing a state after the completion of the semiconductor device.

On the open hole 8, a shield resin 10 is formed for shielding the bonding wire 9 and the pad 7 from the outside. Furthermore, on the ball pad portion 2BP, for example, a solder bump (also referred to as a solder ball) 11 comprising solder is formed. The solder bump 11 constitutes an outside electrode of the semiconductor chip 6. An example of the thickness of the polyimide tape 1 in this state is about 0.075 mm±0.008 mm. An example of thickness of the adhesive agent layer 4 is 0.05 mm±0.01 mm. An example of the thickness of the chip 6 is 0.38 mm±0.02 mm.

Furthermore, a solder bump 11' formed on the peripheral area 13 on the outside of the pad area 12 is referred to as an option ball, and has a function of heightening the mechanical strength of the TAB type ball grid array semiconductor device.

The solder bump (the option ball) 11' is formed on the option pad portion 2BP', and the option pad portion 2BP' is formed on the peripheral area 13.

FIGS. 5A, 5B, 5C and 5D are sectional views showing a method for manufacturing the semiconductor device according to the present invention.

Figure 5A:
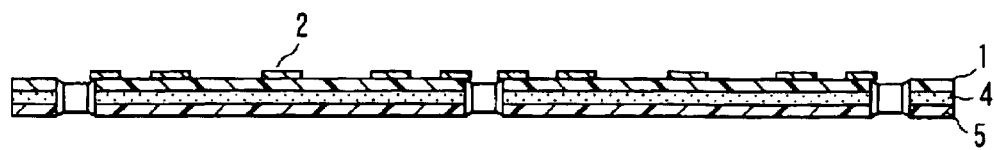
FIGS. 5A, 5B, 5C and 5D are sectional views showing a method for manufacturing the semiconductor device according to the present invention respectively.

In the beginning, as shown in FIG. 5A, there is prepared the polyimide tape 1 on which the Cu pattern 2 is formed.

Figure 5B:
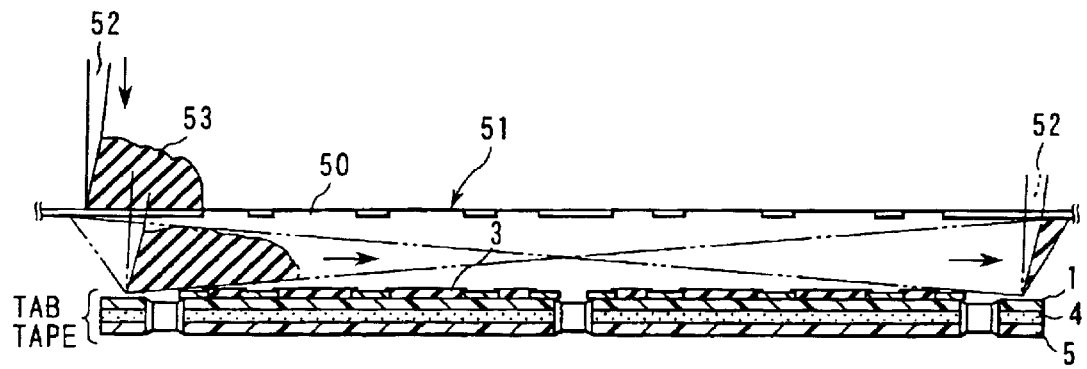

Next, as shown in FIG. 5B, a screen 51 having a window 50 corresponding to the solder resist layer formation pattern is allowed to come close to the Cu pattern 2. Next, a squeegee 52 is allowed to move in a direction shown by an arrow so that a paste-like solder resist 53 is printed on the tape 1 via the screen 51 thereby forming the solder resist layer 3. As a consequence, the TAB tape is completed.

Figure 5C:
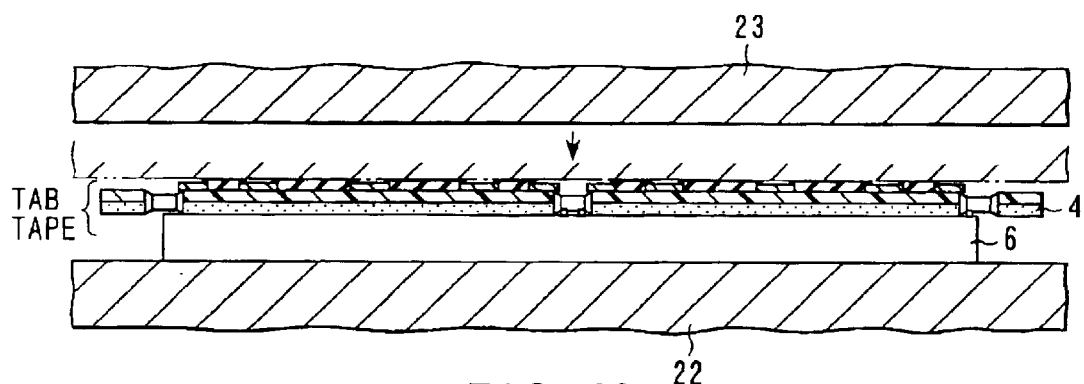

Next, as shown in FIG. 5C, the semiconductor chip 6 is placed on a lower mold 22. Next, after the position of the TAB tape having the protection tape 5 peeled off and the position of the chip 6 are corrected, an upper mold 23 is allowed to come down so that the TAB tape is heat pressurized to the chip 6. As a consequence, the chip 6 is adhered to the TAB tape.

Figure 5D:
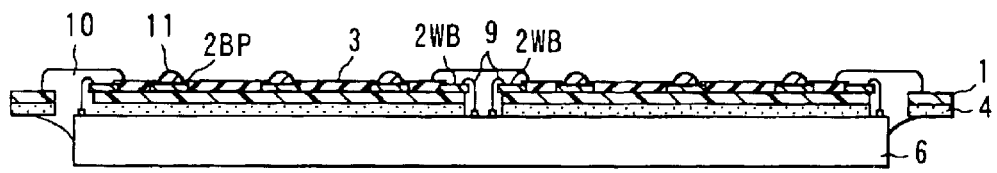

Next, as shown in FIG. 5D, the wire bonding portion 2WB of the Cu pattern 2 is connected to the pad 7 of the chip 6 with the bonding wire 9. Next, the bonding wire 9 and the pad 7 are shielded with resin 10, and a solder bump 11 is formed on the ball pad portion 2BP with the result that the semiconductor device according to the present invention is completed.

The semiconductor device according to the first embodiment of the semiconductor device includes mainly three elements.

The elements will be explained in order hereinafter.

(First Element)

Figure 6A:
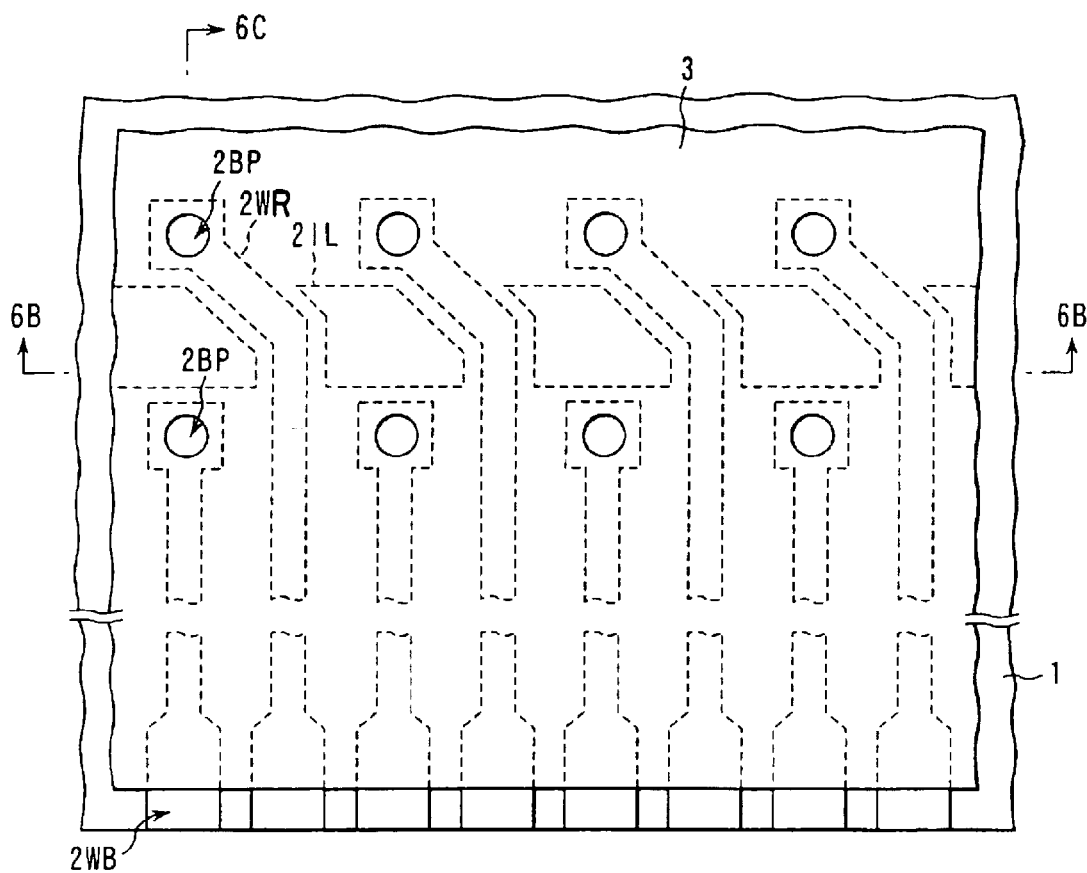
FIG. 6A is a plan view showing a first basic pattern of the TAB tape provided in the semiconductor device according to the present invention.
Figure 6B:
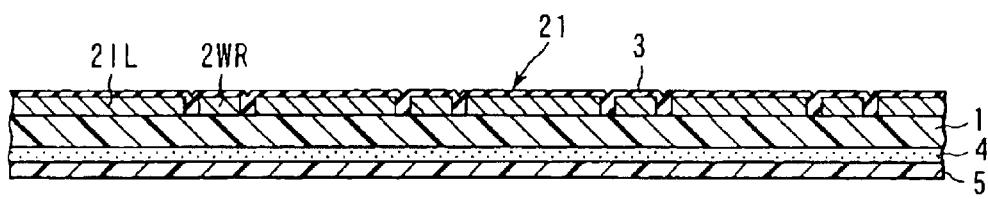
FIG. 6B is a sectional view taken along the line 6B—6B of FIG. 6A.
Figure 6C:
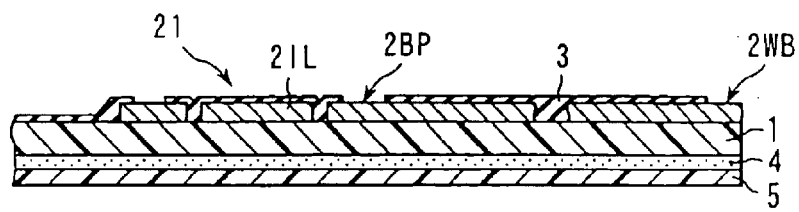
FIG. 6C is a sectional view taken along the line 6C—6C of FIG. 5A.

FIG. 6A is a plan view showing a first basic pattern of the TAB tape provided in the semiconductor device according to the present invention. FIG. 6B is a sectional view taken along the line 6B—6B of FIG. 6A. FIG. 6C is a sectional view taken along the line 6C—6C of FIG. 6A.

The Cu pattern 2 in the first embodiment has, as shown in FIGS. 6A through 6C, an electrically floating island-like portion 2IL in addition to the wire bonding portion 2WB, the ball pad portion 2BP, the wiring portion 2WR. The island-like portion 2IL is arranged between the wiring portions 2WR or ball pad portions 2BP.

Figure 2A:
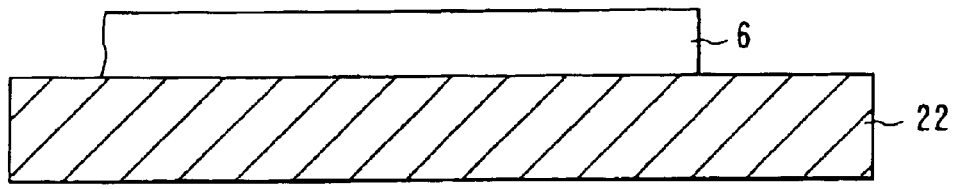
FIGS. 2A, 2B and 2C are sectional views showing a heat pressurizing step respectively.
Figure 2B:
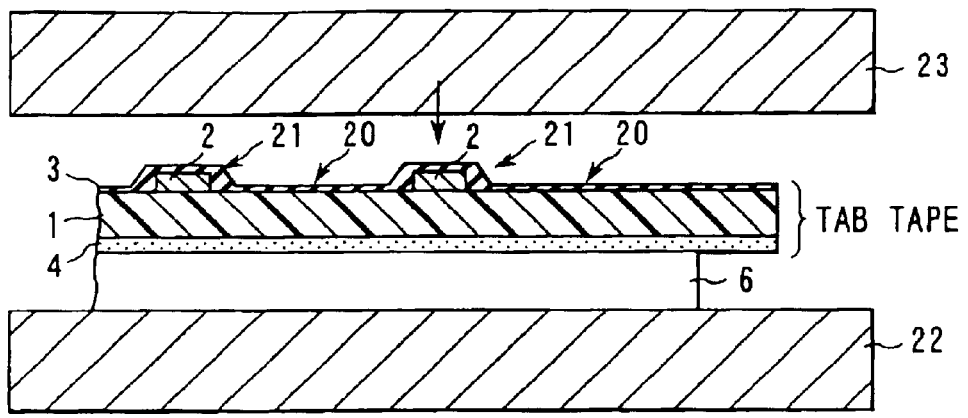
Figure 2C:
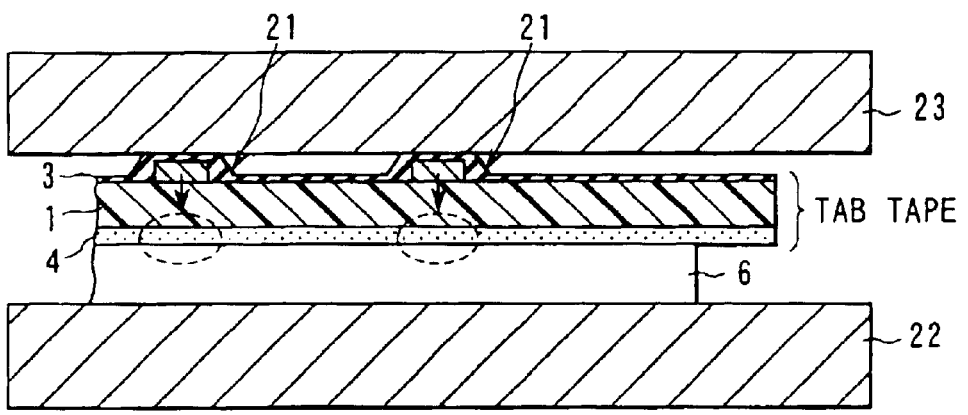
Figure 7A:
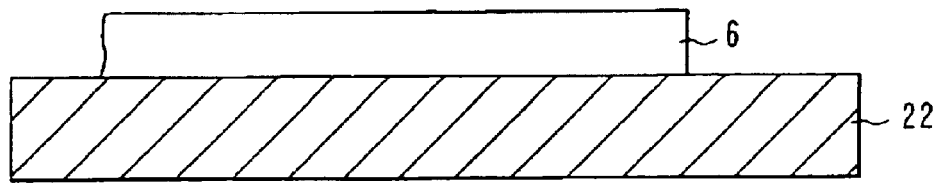
FIGS. 7A, 7B and 7C are sectional views showing the heat pressurizing step respectively.
Figure 7B:
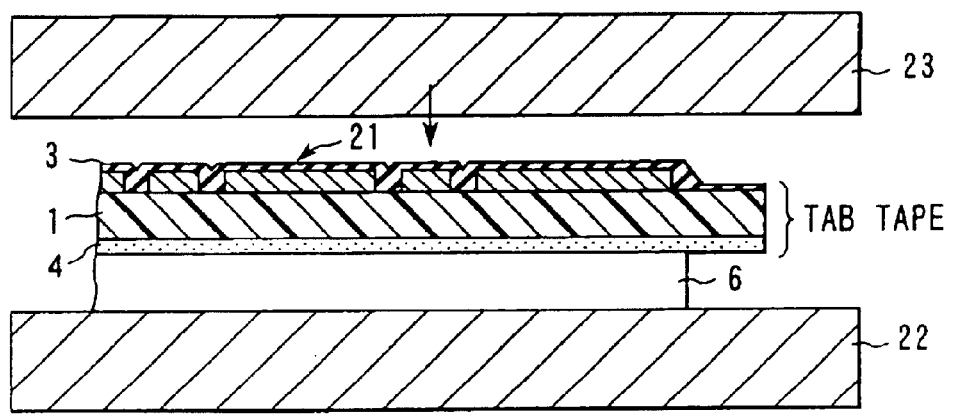
Figure 7C:
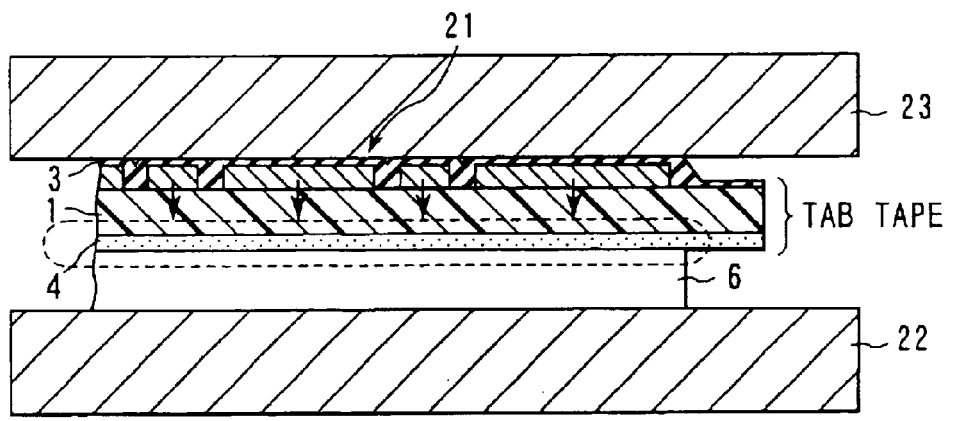

The Cu pattern 2 has the island-like portion 2IL so that the area of a convex portion 21 increases and the uneven configuration resulting from the presence and the absence of the Cu pattern 2 can be alleviated. As a consequence, at the time of the heat pressurizing step shown in FIGS. 7A through 7C, a difference in the pressure distribution applied to the chip 6 can be alleviated as compared, for example, with the conventional example shown in FIG. 2C. As a consequence, the adherence force between the TAB tape and the chip 6 can be made small with the result that a semiconductor device having a stable adherence can be obtained.

It is preferable that a region for arranging the island-like portion 2IL is arranged along the peripheral area 13 at least outside of the pad area 12, namely along the peripheral portion of the chip 6.

In the peripheral portion of the chip 6, an adherence with the TAB tape is heightened by arranging the island-like portion 2IL in the peripheral area 13 in this manner, a stronger pressure endurance can be obtained against the separation.

FIGS. 8A, 8B, 8C and 8D are plan views showing basic patterns of the island-like portion respectively.

By the way, when the Cu pattern 2 has an island-like portion 2IL, it is feared that the parasitic capacity of the wiring portion 2WR increases, and the electric characteristic of the wiring portion 2WR, particularly, the RCL characteristic is affected.

Figure 8A:
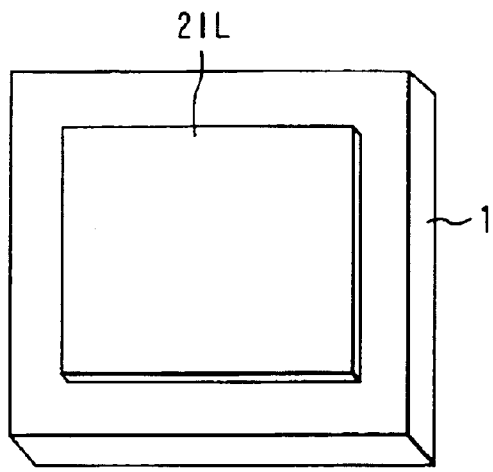
FIGS. 8A, 8B, 8C and 8D are plan views showing basic patterns of an island-like portion respectively.
Figure 8B:
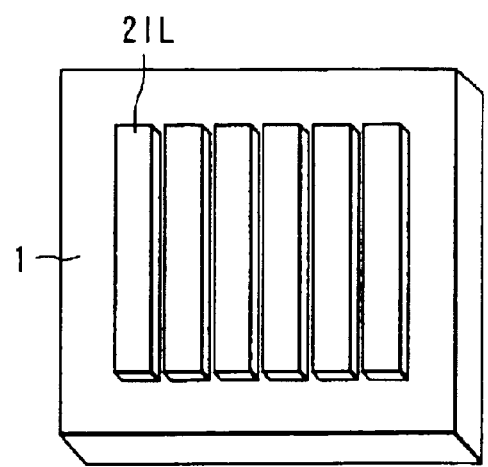
Figure 8C:
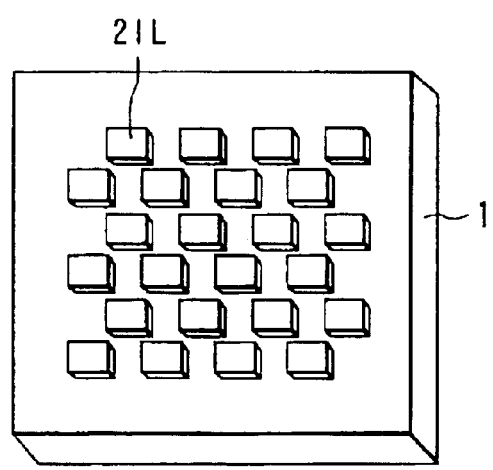
Figure 8D:
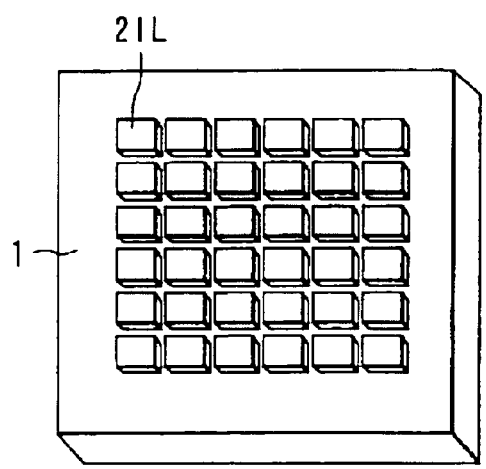

This influence can be minimized by changing the design of the island-like portion 2IL into a stripe pattern shown in FIG. 8B, a checker pattern shown in FIG. 8C and a lattice-like (matrix-like) pattern shown in FIG. 8D, instead of a planer pattern shown in FIG. 8A. For example, patterns shown in FIGS. 8B through 8D have a gap therebetween. For the portion of this gap, for example, the parasitic capacity of the wiring portion 2WR can be reduced so that the electric characteristic of the wiring portion 2WR, particularly, the influence upon the RCL characteristic can be minimized. Furthermore, by changing the design of the island-like portion 2IL, the electric characteristic of the wiring portion 2WR can be adjusted.

(Second Element)

Figure 9A:
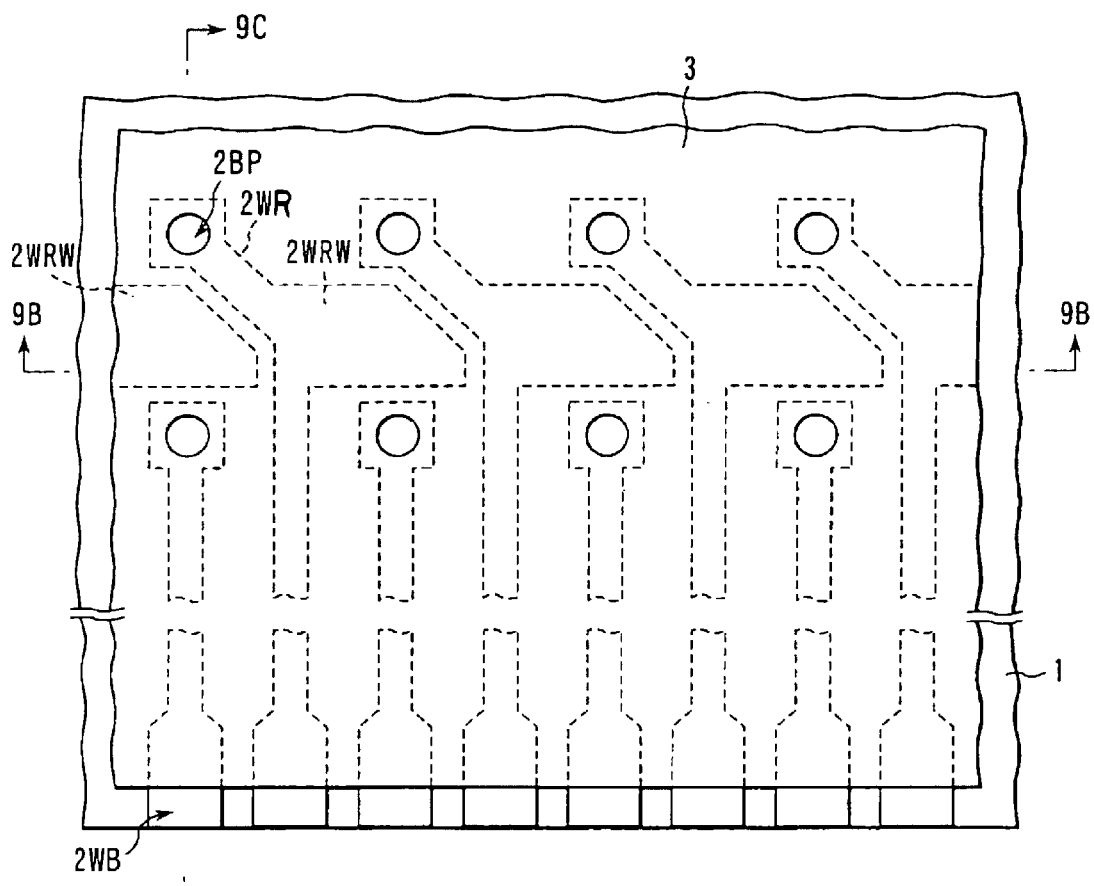
FIG. 9A is a plan view showing a second basic pattern of the TAB tape provided in the semiconductor device according to the present invention.
Figure 9B:
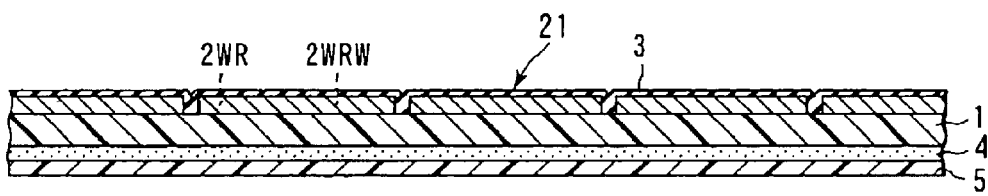
FIG. 9B is a sectional view taken along the line 9B—9B of FIG. 9A.
Figure 9C:
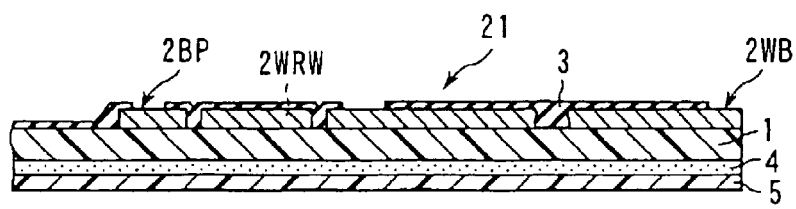
FIG. 9C is a sectional view taken along the line 9C—9C of FIG. 9A.

FIG. 9A is a plan view showing a second basic pattern of the TAB tape provided in the semiconductor device according to the present invention. FIG. 9B is a sectional view taken along the line 9B—9B of FIG. 9A. FIG. 9C is a sectional view taken along the line 9C—9C of FIG. 9A.

The Cu pattern 2 in the first embodiment has, as shown in FIG. 9A through 9C, has a tend portion 2WRW having a widened width at least on a portion of the wiring portion 2WR. The tend portion 2WRW reduces a gap D between the wiring portions 2WRW and the ball pad portions 2BP.

Figure 10A:
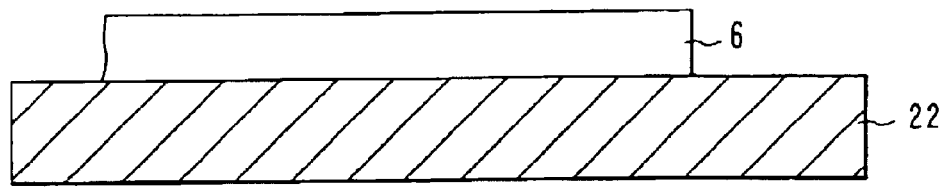
FIGS. 10A, 10B, and 10C are sectional views showing the heat pressurizing step respectively.
Figure 10B:
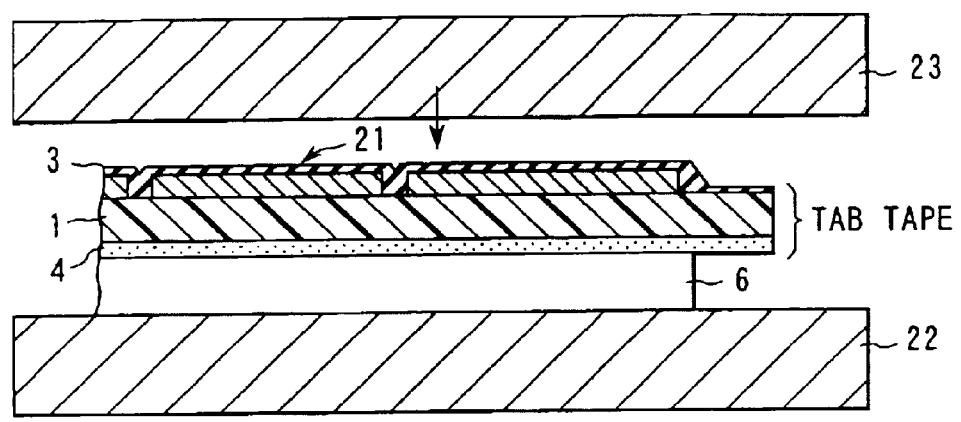
Figure 10C:
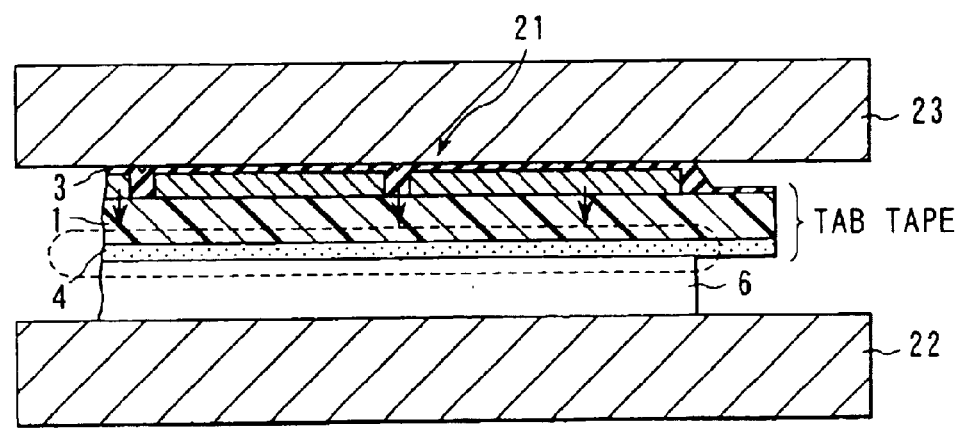

The Cu pattern 2 has a tend portion 2WRW so that the area of the convex portion 21 can be increased in the same manner as the case in which the island-like portion 2IL is provided. Consequently, at the time of heat pressurizing step shown in FIGS. 10A through 10C, a difference in the pressure distribution applied to the chip 6 can be alleviated as compared with conventional example shown in FIG. 2C. Consequently, a difference in the adherence between the TAB tape and the chip 6 can be made small with the result that a semiconductor device having a stable adherence can be obtained.

Preferably, a portion for providing the tend portion 2WRW is arranged at least along an outside peripheral area 13 of a pad area 12, namely along the peripheral portion of the chip 6.

Furthermore, the tend portion 2WRW can be obtained by expanding, for example, the width of the wiring portion 2WR with the result that there is an advantage that the tend portion 2WRW can be easily provided on a portion where the island-like portion 2IL can be provided with difficulty, and the wiring density is high.

In the case where the expanded portion 2WRW is provided on a portion where the wiring density is dense, a large tend portion 2WRW is required, and the capacity of the wiring portion 2WR largely increases.

The island-like portion 2IL and the tend portion 2WRW may be respectively provided appropriately in consideration of the electric characteristic of the semiconductor device. One example of an appropriate arrangement is such that, as shown in FIG. 4A, the island-like portion 2IL is provided in the peripheral portion 13 where the wiring density is relatively rough, and the tend portion 2WRW is provided on a pad area 12 where the wiring density is relatively dense.

FIGS. 11A, 11B, 11C and 11D are plan views showing basic patterns of the expanded portion respectively.

Figure 11A:
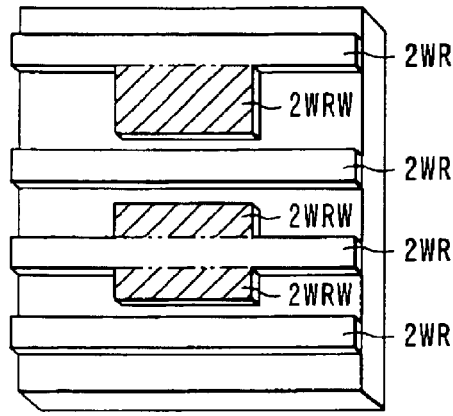
FIGS. 11A, 11B, 11C and 11D are plan views showing basic patterns of an expanded portion respectively.
Figure 11C:
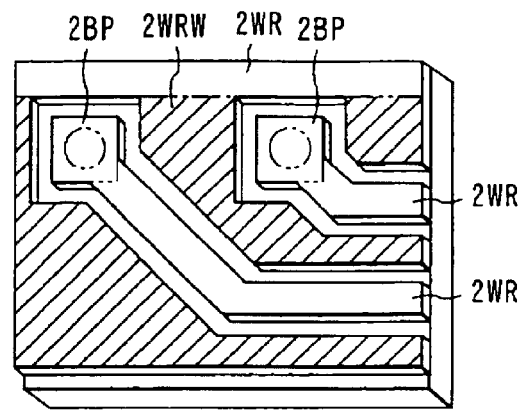
Figure 11B:
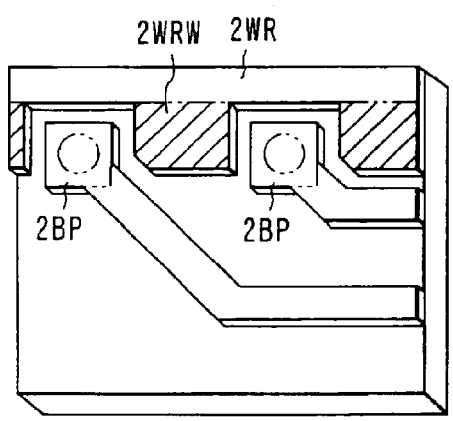
Figure 11D:
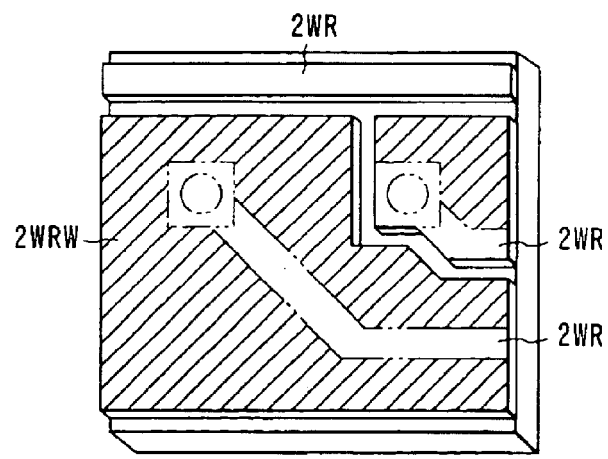

The configuration of the basic patterns of the tend portion 2WRW is, as shown in FIG. 11A, a fin-like configuration which projects either to one side or both sides of the wiring portion 2WRW, or the fin-like configuration which is expanded of the wiring portion. The expanded portion 2WRW having a fin-like configuration is provided on route of the wiring portion 2WR so as to reduce a gap D between adjacent wiring portion 2WR as shown in FIG. 11A. Otherwise, as shown in FIG. 11B, the fin-like configuration is provided so as to extend between separate Cu patterns 2 so that a gap between the ball pad portions of these separate Cu pattern 2 is reduced. Otherwise, as shown in FIG. 11C, the fin-like expanded portion 2WRW is provided so as to reduce the gap between the wiring portions 2WR. Furthermore, the fin-like tend portion 2WRW may be provided at the end of the wiring portion 2WR as shown in FIG. 11D.

As the hardness of such tend portion 2WRW and the Cu pattern 2 including the island-like portion 2IL, Vickers hardness of 170 HV is preferable. Setting the hardness to such level is based on the viewpoint of suppressing the collapse of the Cu pattern 2.

Besides, one example of the tend portion 2WRW according to the present invention, and the wiring density in the case where the Cu pattern 2 including the island-like portion 2IL is provided is Cu pattern area/tape area=68.5%. The conventional wiring density is Cu pattern area/tape area= 45.7%. From this viewpoint, when the wiring density (Cu pattern area/tape area) exceeds the wiring density=45.7%, the adherence is heightened as compared with the conventional device.

(Third Element)

Figure 12A:
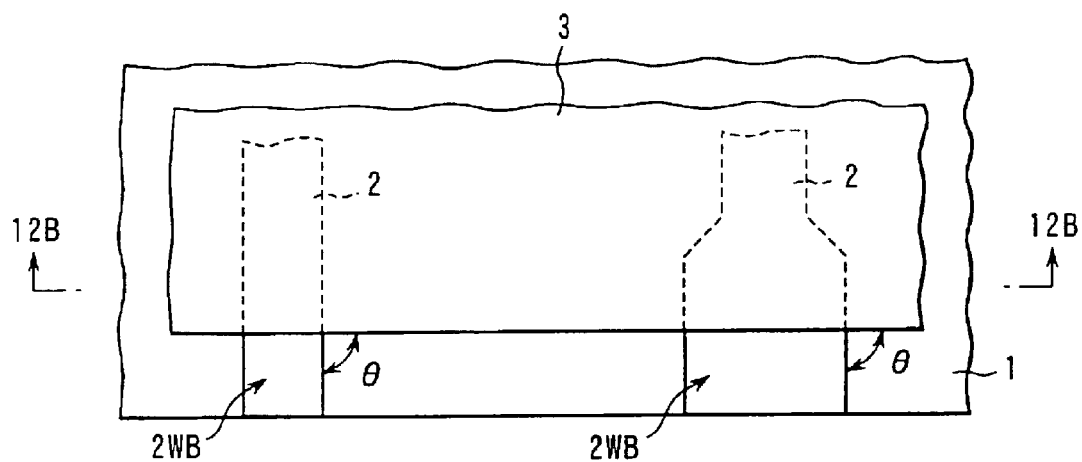
FIG. 12A is a plan view showing a third basic pattern of the TAB tape provided in the semiconductor device according to the present invention.
Figure 12B:
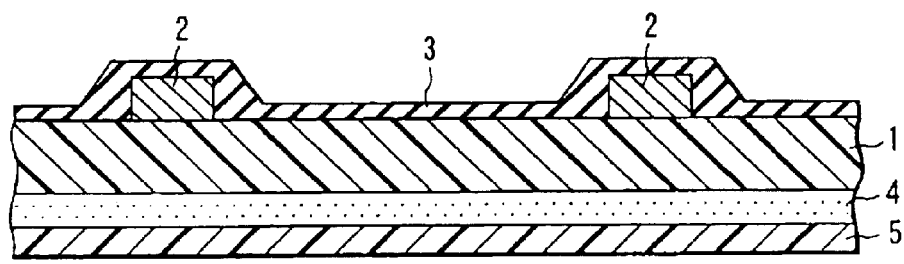
FIG. 12B is a sectional view taken along the line 12B—12B of FIG. 12A.

FIG. 12A is a plan view showing a third basic pattern of the TAB tape provided in the semiconductor device according to the present invention. FIG. 12B is a sectional view taken along the line 12B—12B of FIG. 12A.

Figure 3A:
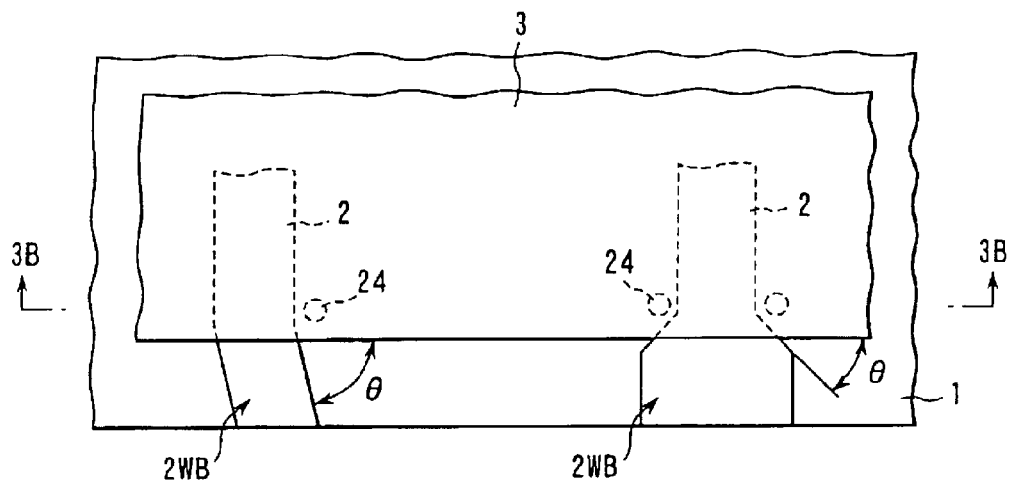
FIG. 3A is a plan view showing a conventional TAB tape.
Figure 3B:
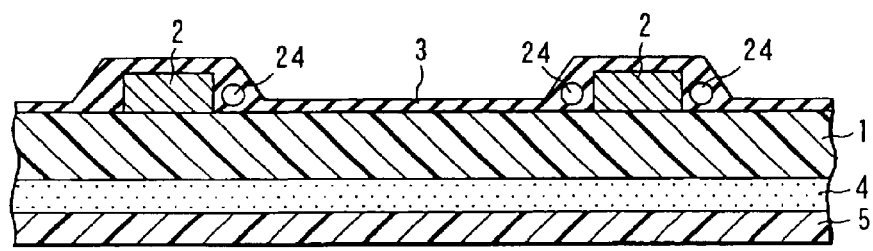
FIG. 3B is a sectional view taken along the line 3B—3B of FIG. 3A.

With respect to the Cu pattern 2 according to the first embodiment, as shown in FIGS. 12A and 12B, an intersection angle θ between the wire bonding portion 2WB and an edge of the solder resist layer 3 is maintained at 90 degrees or more. The bubbles are hardly involved at the time of printing in the Cu pattern 2 in the vicinity of the wire bonding portion 2WB as compared with the conventional example in which a portion is generated which has an intersection angle of 90 degrees or less shown in FIG. 3A by maintaining the intersection angle θ of 90 degrees. As a result of the fact that the bubbles are involved with difficulty, the bubbles are generated with difficulty in the solder resist layer 3 and between the solder resist layer 3 and the polyimide tape 1 so that the situation of the corrosion of the Cu pattern 2 is suppressed with the lapse of time. As a consequence, a semiconductor device having a high reliability against the erosion of the conductive pattern can be obtained.

Figure 13A:
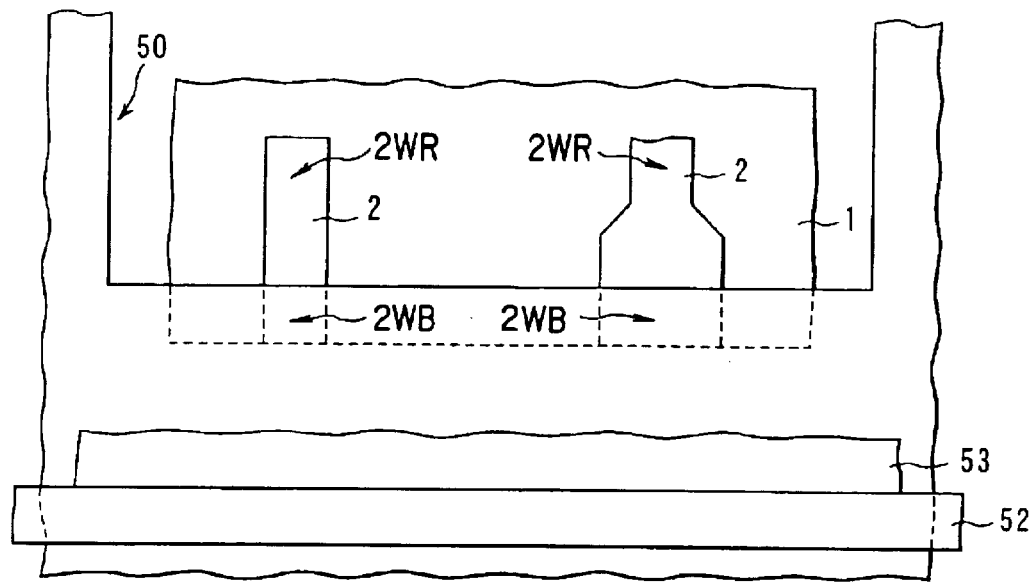
FIGS. 13A and 13B are plan views showing a printing step respectively.
Figure 13B:
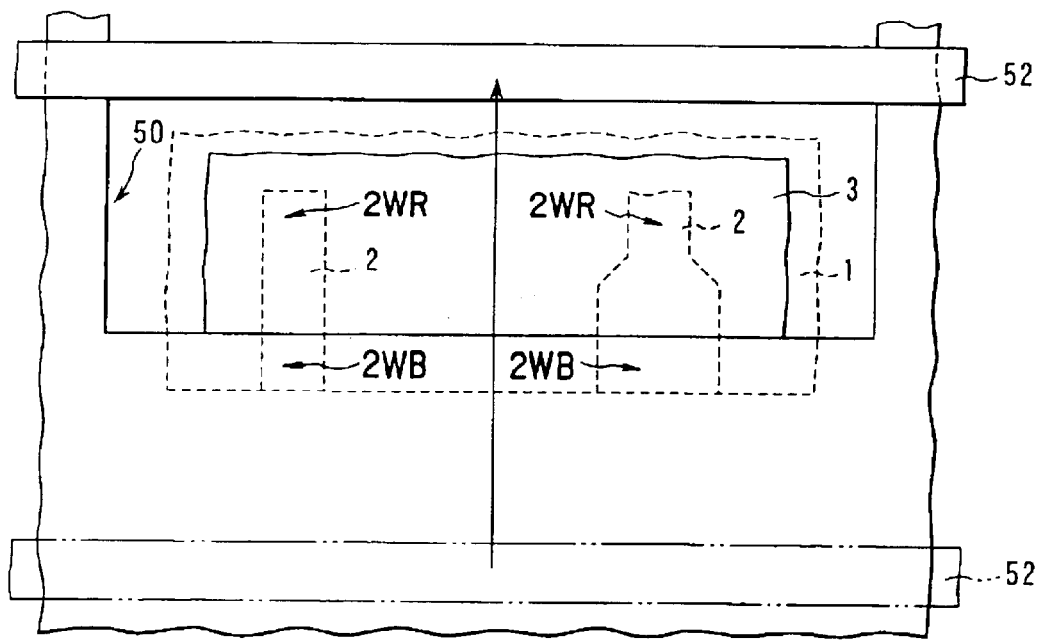

FIGS. 13A and 13B are plan views showing an example of a step of printing a solder resist onto the tape 1 having the above Cu pattern 2.

As shown in FIG. 13A, a screen 51 having a window 50 corresponding to the solder resist layer formation pattern is allowed to come close to the Cu pattern 2.

Next, as shown in FIG. 13B, the squeegee 52 is moved along the direction of an arrow in FIG. 13B. Specifically, the squeegee 52 is moved from the wire bonding portion 2WB to the wiring port ion 2WR, with the result that the paste-like solder resist layer 53 is printed on the tape 1 via the window 50 of the screen 51. As a consequence, the solder resist layer 3 is formed where bubbles are generated with difficulty.

FIGS. 14A and 14B are plan views showing the basic patterns of the bonding portion respectively.

The Cu pattern 2 shown in FIG. 14A is a case in which the intersection angle θ is maintained at 90 degrees. The Cu pattern 2 shown in FIG. 14B is a case in which intersection angle θ is maintained at 90 degrees or more. In the case where the intersection angle θ is maintained at 90 degrees or more, the configuration of the wire bonding portion 2WB may be formed in a tapered configuration toward the end.

Next, another embodiment of the present invention will be explained.

(Second Embodiment)

Figure 16:
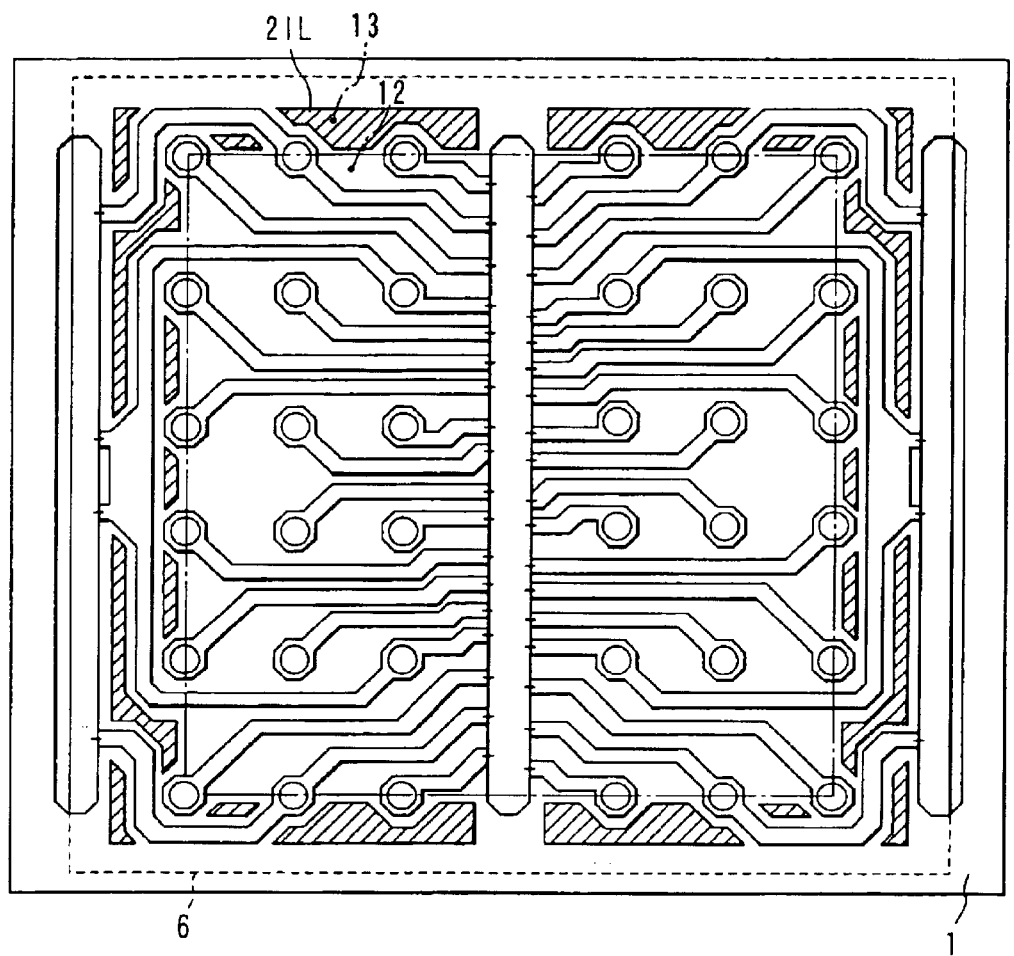
FIG. 16 is a plan view showing a semiconductor device according to a second embodiment of the present invention.

FIG. 15 is a plan view showing a semiconductor device according to a reference example of the present invention. FIG. 16 is a plan view showing a semiconductor device according to a second embodiment of the present invention.

As shown in FIG. 16, the semiconductor device according to the second embodiment is an example in which an island-like portion 2IL is further provided on the Cu pattern 2 in the reference example shown in FIG. 15. The island-like portion 2IL of the embodiment is provided outside of the pad area 12, namely, in the peripheral area 13.

Incidentally, the second embodiment is an example in which the option pad 2BP' shown in the first embodiment is not provided.

(Third Embodiment)

Figure 17:
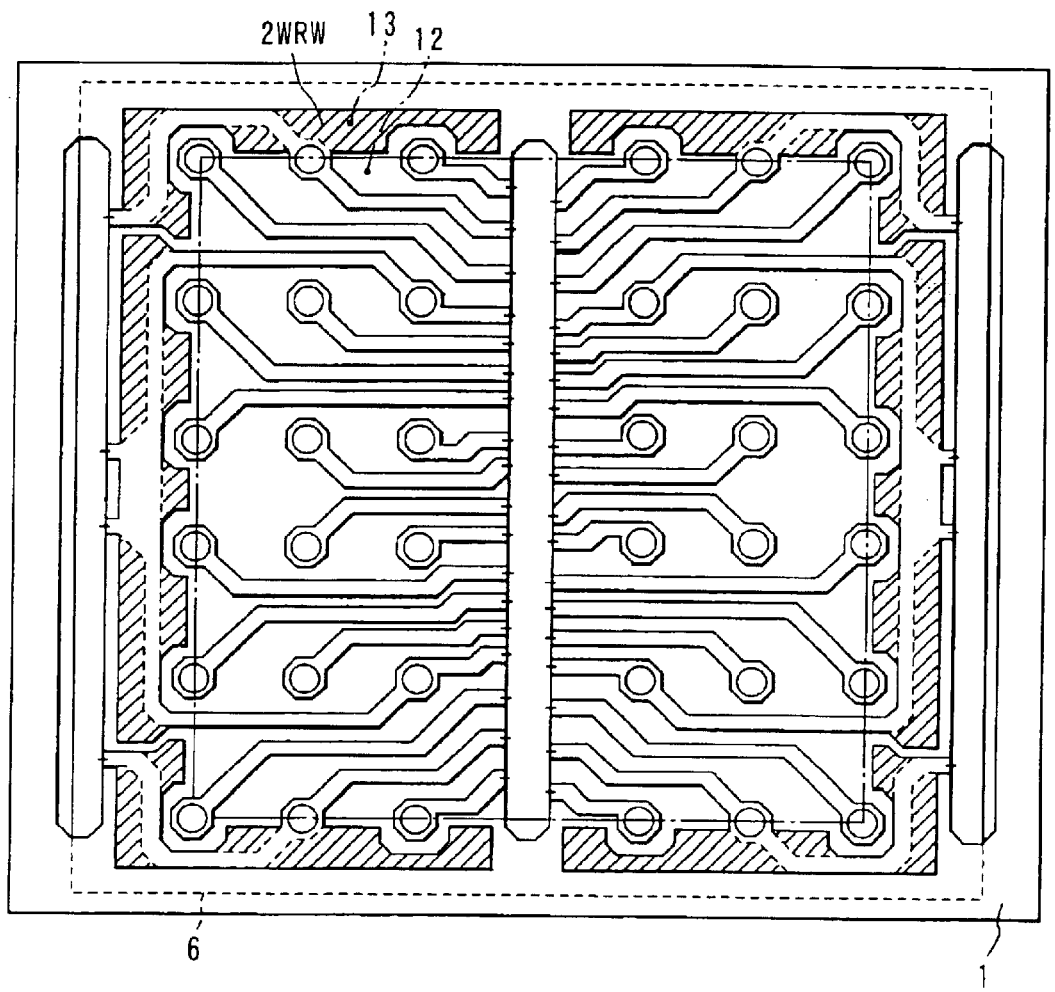
FIG. 17 is a plan view showing a semiconductor device according to a third embodiment of the present invention.

FIG. 17 is a plan view showing a semiconductor device according to a third embodiment of the present invention.

As shown in FIG. 17, the semiconductor device according to the third embodiment is an example in which the tend area 2WRW is further provided outside of the pad area 12, namely, on the Cu pattern 2 of the reference example. The tend portion 2WRW of the embodiment is provided outside of the pad area 12, namely the peripheral area 13.

(Fourth Embodiment)

Figure 18:
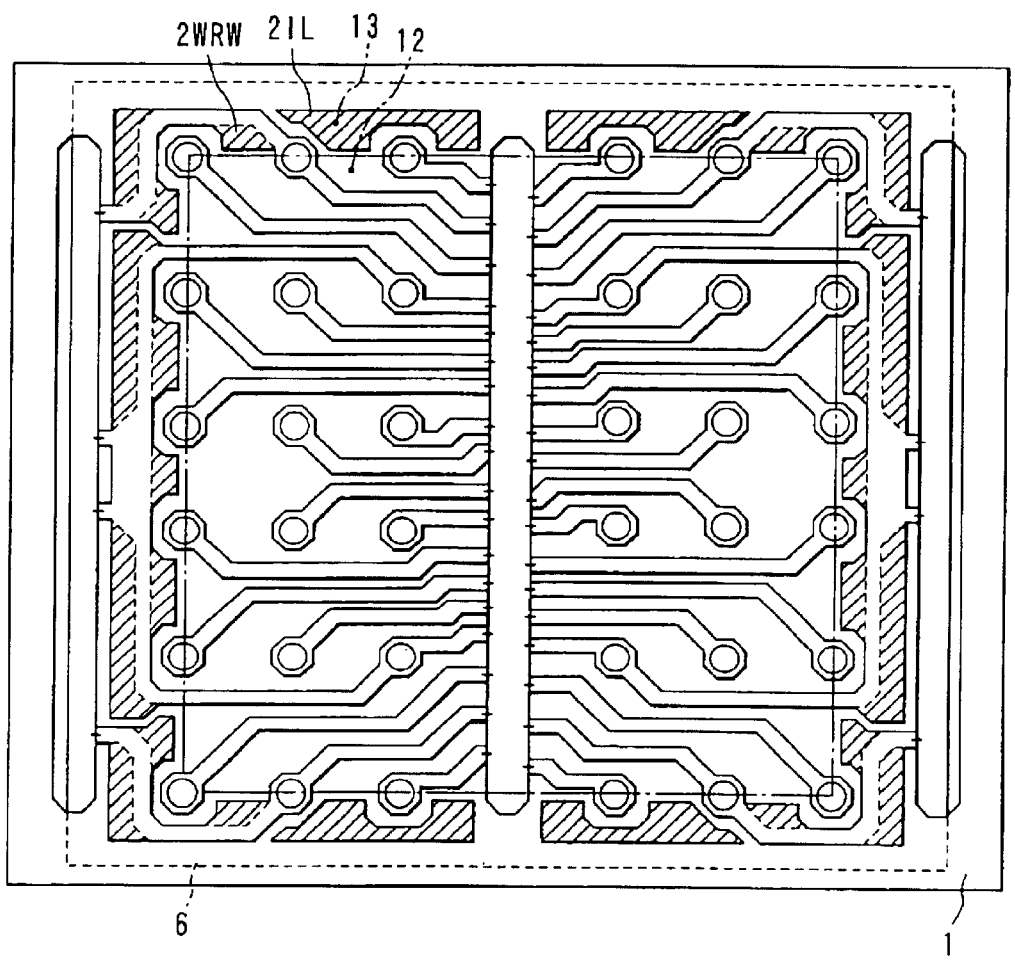
FIG. 18 is a plan view showing a semiconductor device according to a fourth embodiment of the present invention.

FIG. 18 is a plan view showing a semiconductor device according to a fourth embodiment of the present invention.

As shown in FIG. 18, the semiconductor device according to the fourth embodiment of the present invention is an example in which the island-like portion 2IL and the tend portion 2WRW are further provided respectively on the Cu pattern 2 of the reference example shown in FIG. 15. The island-like portion 2IL and the tend portion 2WRW are provided respectively on the outside of the pad area 12, namely in the peripheral area 13.

(Fifth Embodiment)

Figure 19:
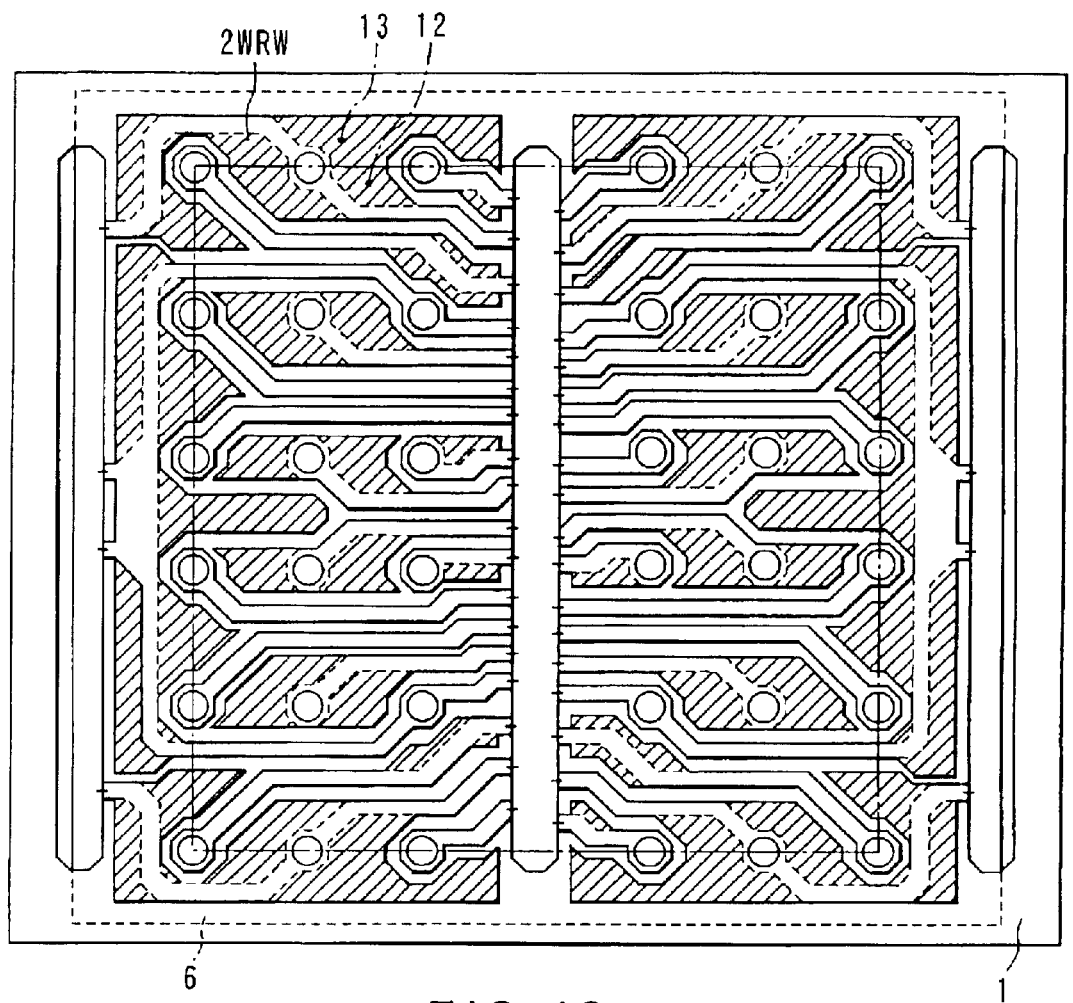
FIG. 19 is a plan view showing a semiconductor device according to a fifth embodiment of the present invention.

FIG. 19 is a plan view showing a semiconductor device according to a fifth embodiment of the present invention.

As shown in FIG. 19, the semiconductor device according to the fifth embodiment of the present invention is an example in which the tend portion 2WRW is provided on the Cu pattern 2 of the reference example shown in FIG. 15. And, at the same time, the tend portion 2WRW is provided in the pad area 12, and the peripheral area 13 respectively. In particular, in the fifth embodiment, the expanded portion 2WRW is provided over the while pad area 12 and the peripheral area 13.

(Sixth Embodiment)

Figure 20:
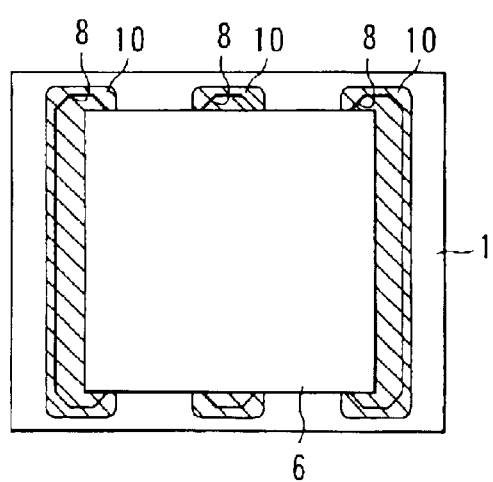
FIG. 20 is a plan view showing a semiconductor device according to the present invention.
Figure 21:
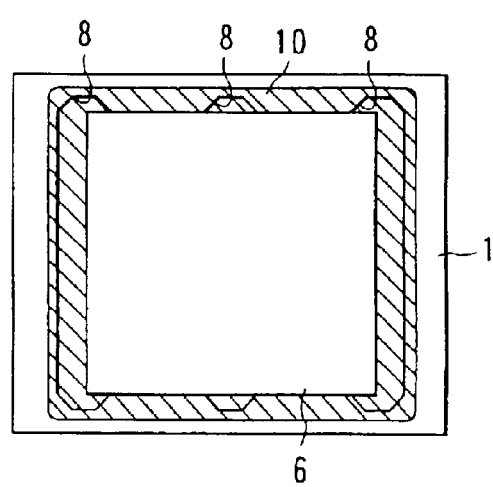
FIG. 21 is a plan view showing a semiconductor device according to a sixth embodiment of the present invention.

FIG. 20 is a plan view showing a semiconductor device according to the present invention. FIG. 21 is a plan view showing the semiconductor device according to the sixth embodiment of the present invention. Incidentally, FIGS. 20 and 21 are plan views showing the semiconductor device as seen from the side of the chip 6 not from the side of the tape 1.

As shown in FIG. 20, when the semiconductor devices according to the first to the fifth embodiments are observed from the side of the chip 6, the shield resin 10 is present only on the periphery of the open hole 8 of the tape 1.

In the sixth embodiment, as shown in FIG. 21, the shielded resin 10 is allowed to present on the whole periphery of the chip 6 so that the adherence of the chip 6 and the tape 1 can be further stabilized.

In the above description, the present invention has been explained with respect to the first to the sixth embodiments of the present invention. The present invention is not restricted thereto, and the invention can be modified in various ways within the scope of not departing from the gist of the invention.

For example, as a conductive pattern 2, copper (Cu) is given, copper can be replaced with copper alloy or other conductive material. Furthermore, in the case where copper is replaced with copper alloy or other conductive material, preferably, the hardness may be at least 170 HV or more.

Furthermore, as a pad arrangement of the semiconductor chip, an example is shown wherein the pad is arranged on the periphery of the chip, and on the center of the chip. The pad arrangement is provided either on the periphery of the chip or in the center of thee chip.

Furthermore, as a semiconductor product formed in the semiconductor chip, products which requires a compact package such as a SRAM, FLAS, H-EEPROM, DRAM, mixedly mounted DRAM, CPU or the like are particularly preferable.

Furthermore, the first to the sixth embodiments can be practiced as a single entity. However, the embodiments can be practiced by a combination of the embodiments in various manners.

As has been described above, according to the present invention, a semiconductor device can be provided which has a reduced difference in adherence force between the tape and the chip, and which has a stable adherence.

Furthermore, a semiconductor device can be provided which suppresses the generation of bubbles and which has a high reliability against the erosion of the conductive pattern.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor devices comprising:
    a semiconductor chip including a main surface on which pads are formed, and a rear surface opposite to the main surface;
    an insulating base comprising a main surface including a pad area and a peripheral area located outside the pad area, and a rear surface opposite to the main surface, the rear surface of the insulating base being adhered to the main surface of the semiconductor chip;
    conductive patterns formed on the main surface of the insulating base, the conductive patterns including bonding portions, pad portions and wiring portions connecting the bonding portions and the pad portions, the bonding portions being arranged in the peripheral area, the pad portions being arranged in the pad area, the wiring portions being arranged in both the peripheral area and the pad area;
    island-like patterns provided along the wiring portions of the peripheral area;
    outside electrodes provided on the pad portions of the conductive patterns, the outside electrodes being provided on the main surface of the insulating base, and
    a covering layer which covers those of the conductive patterns at least except the bonding portions and the pad portions,
    wherein an area of one of the island-like patterns is larger than an area of one of the pad portions and an intersection angle between an edge of the covering layer and one of the bonding portions is more than 90 degrees.

2. The semiconductor device according to claim 1, wherein the peripheral area surrounds the pad area and the island-like patterns are arranged around the pad area.

3. The semiconductor device according to claim 2, wherein the pad area and the peripheral area are located above the semiconductor chip.

4. The semiconductor device according to claim 3, wherein the insulating base is a TAB tape.

5. The semiconductor device according to claim 3, wherein the island-like patterns are formed of the same conductive material as the conductive patterns.

6. The semiconductor device according to claim 5, wherein the conductive material has a Vikers hardness of at least 170 HV.

7. The semiconductor device according to claim 3, wherein the conductive patterns include an option pad portion provided in the peripheral area.

8. The semiconductor device according to claim 3, wherein the wiring portions each have a tend portion.

9. The semiconductor device according to claim 8, wherein the tend portion has a fin-like configuration.

10. The semiconductor device according to claim 9, wherein the tend portion extends between the wiring pattern and another wiring pattern.

11. The semiconductor device according to claim 8, wherein the tend portion is provided in the peripheral area.

12. The semiconductor device according to claim 8, wherein the tend portion is provided in the pad area.

13. The semiconductor device, according to claim 3, wherein the island-like portions each include at least one of a planar pattern, a stripe pattern, a checker pattern and a mesh pattern.

14. The semiconductor device according to claim 3, further comprising an additional island-like pattern provided along the pad portions of the pad area.

15. The semiconductor device according to claim 1, wherein the bonding portions are tapered such that the bonding portions are thinner toward tips of the bonding portions.

16. The semiconductor device according to claim 1, wherein the covering layer is a resist layer.

17. The semiconductor device according to claim 16, wherein the resist layer is a solder resist layer.

18. The semiconductor device according to claim 1, wherein the covering layer is formed by printing a resist.

19. The semiconductor device according to claim 18, wherein the resist is a solder resist.

* * * * *